United States Patent
Zheng (10) Patent No.: US 9,488,761 B2
(45) Date of Patent: Nov. 8, 2016

(54) METHOD FOR FABRICATING COLOR FILTER SUBSTRATE

(71) Applicant: Shenzhen China Star Optoelectronics Technology Co., Ltd., Shenzhen, Guangdong (CN)

(72) Inventor: Hua Zheng, Guangdong (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 134 days.

(21) Appl. No.: 14/395,496

(22) PCT Filed: Sep. 16, 2014

(86) PCT No.: PCT/CN2014/086641
§ 371 (c)(1),
(2) Date: Oct. 20, 2014

(87) PCT Pub. No.: WO2016/033829
PCT Pub. Date: Mar. 10, 2016

(65) Prior Publication Data
US 2016/0070039 A1    Mar. 10, 2016

(51) Int. Cl.
*G02F 1/1335* (2006.01)
*B29D 11/00* (2006.01)
*G02B 5/22* (2006.01)
*G03F 7/00* (2006.01)
*G03F 7/16* (2006.01)
*G03F 7/20* (2006.01)
*G03F 7/36* (2006.01)
*G02F 1/1333* (2006.01)

(52) U.S. Cl.
CPC ........... *G02B 5/22* (2013.01); *G02F 1/133305* (2013.01); *G02F 1/133512* (2013.01); *G02F 1/133514* (2013.01); *G02F 1/133516* (2013.01); *G03F 7/0007* (2013.01); *G03F 7/16* (2013.01); *G03F 7/20* (2013.01); *G03F 7/36* (2013.01)

(58) Field of Classification Search
CPC ............... H01L 21/32139; H01L 21/0332; G02F 1/133514
USPC ............... 349/106; 438/551, 552, 717, 736; 216/24
See application file for complete search history.

(56) References Cited

U.S. PATENT DOCUMENTS

| | | | | |
|---|---|---|---|---|
| 6,323,920 B1* | 11/2001 | Kim | .................. | G02F 1/133514 349/106 |
| 6,423,455 B1* | 7/2002 | Tzu | .......................... | G03F 1/32 430/5 |
| 8,582,065 B1* | 11/2013 | Enomoto | .......... | G02F 1/133536 349/122 |
| 8,755,010 B2* | 6/2014 | Yang | ................. | G02F 1/133502 349/106 |
| 2007/0082273 A1* | 4/2007 | Iwanaga | .................. | G03F 1/14 430/5 |

* cited by examiner

*Primary Examiner* — Audrey Y Chang
(74) *Attorney, Agent, or Firm* — Andrew C. Cheng (57) ABSTRACT

The present invention discloses methods and apparatus for fabricating display panels and color filter substrates. The fabricating methods include: providing a glass substrate having a flexible area; forming a etching material layer on a surface of the glass substrate; etching the etching material layer to form black matrices on the glass substrate, wherein the black matrix of the flexible area, which is narrower than the black matrix on the other area, corresponds to a vertical projection of a opaque area between pixels when the flexible area is bending. Hence, the present invention may reduce shadows and improve the transmittance by above methods.

2 Claims, 8 Drawing Sheets

METHOD FOR FABRICATING COLOR FILTER SUBSTRATE

TECHNICAL FIELD

The present invention relates to methods and apparatus for fabricating panels and color filter substrates.

DESCRIPTION OF RELATED ART

The flexible display technology has been developed because the main display companies always desired to attract more consumers, get more profits, and separate the market share from its competitions.

Not many differences of color and performance parameters between the flexible panel and the flat panel. However users shall feel differently when them saw these two different type panels because the flexible panel has bending features, while the flat panel doesn't.

Figure 1:
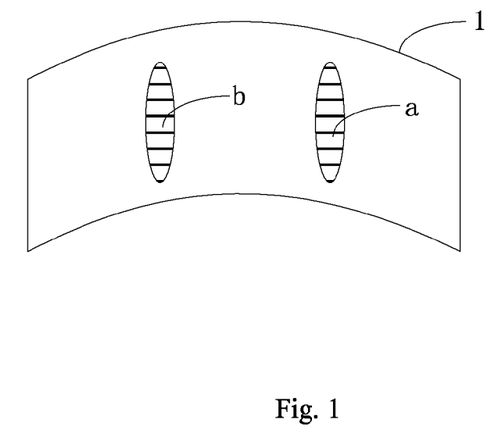
FIG. 1 is a graph showing the shadows on the bending flexible panel according to prior arts.

Since the upper and lower substrates shift mostly, showed as the area A and area B in FIG. 1, shadows very likely are showed in an area which has high curvature on a bending flexible panel.

Figure 2A:
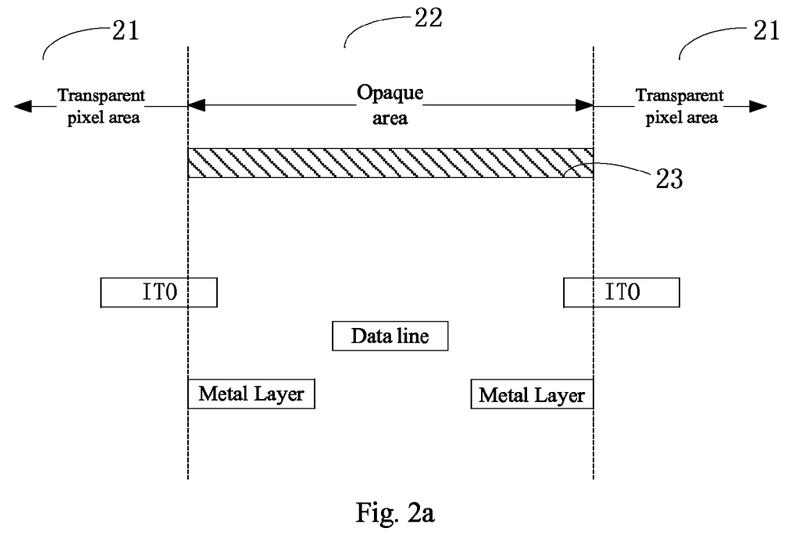
FIG. 2A is a graph showing the location of a black matrix when the flexible panel is not bending according to prior arts.

Panels usually contains matrix substrates and color filter substrates. The matrix substrates contain pixels. Showed as FIG. 2A, the matrix substrate contains a transparent pixel area 21 and opaque area 22 between the pixels, and a color filter substrate, wherein a Black Matrix (BM) 23 is arranged on a vertical projection of the opaque area between the pixels to prevent leaking lights.

In the conventional skill, the width of the black matrices 23 on color filter substrate are usually the same and would be wider to get the better light proof.

Figure 2B:
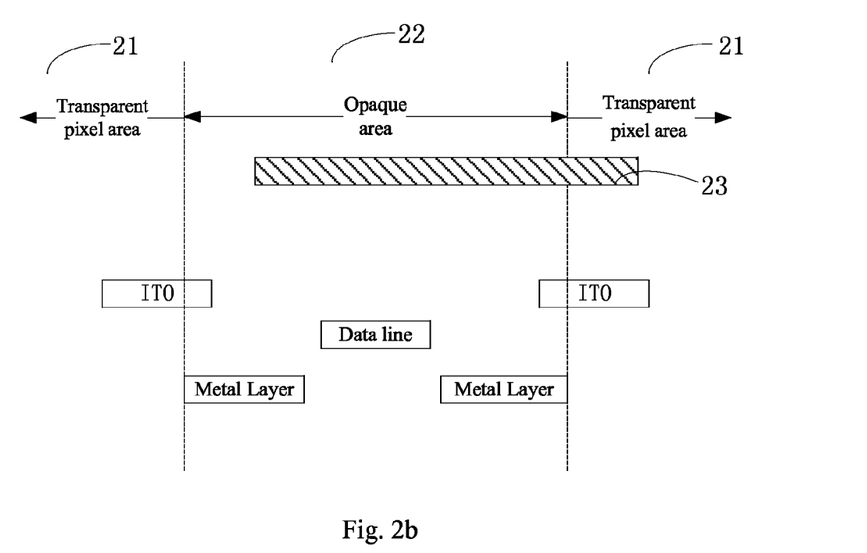
FIG. 2B is a graph showing the location of a black matrix when the flexible panel is bending according to prior arts.

Showed as FIG. 2B, therefore, when the display panel is bending and crossing the matrix substrate and the color filter substrate, it is likely that the Black Matrix 23 would be shifted to the vertical projection of the opaque area, covers the transparent pixel area 21, generates shadows on the bending flexible area, and reduces the transmittance.

SUMMARY

To improve the shortcomings above, the present invention provides methods and apparatus for fabricating panels and color filter substrates to reduce shadows and improve the transmittance.

An apparatus for fabricating color filter substrate, the apparatus comprising: a substrate unit having a glass substrate, wherein the glass substrate further comprising a flexible area; a coating unit for forming an etching material layer on the surface of the glass substrate; a etching unit having a first photomask and a second photomask, wherein the first photomask using for first exposing the etching material layer to forming black matrices with a predetermined width on the glass substrate, and the second photomask overlapping on the first photomask is using for second exposing the etching material layer to narrow the black matrices of the flexible area; wherein the black matrices on the flexible area are narrower than the black matrices on the other area; wherein the black matrices of the flexible area lie on the vertical projections of the opaque areas between pixels when the flexible area is bending; and wherein the second photomask, having a empty area same as the flexible area, is made from emptying the light proof baffle according to the flexible area of the glass substrate.

In this embodiment, the coating unit is using for forming a positive photoresist material layer to provide the etching material layer on the surface of the glass substrate; portions vertically projecting to the black matrix of the first photomask are opaque areas, the other portions of the first photomask are transparent areas; and portions corresponding to the flexible area of second photomask are transparent areas, and the other portions of the second photomask are opaque areas.

In this embodiment, the second photomask made by metal or alloy.

A method for fabricating color filter substrate, the method comprising: providing a glass substrate which has a flexible area; forming an etching material layer on a surface of the glass substrate; etching the etching material layer to form black matrices on the glass substrate; wherein the black matrices on the flexible area are narrower than the black matrices on the other areas; and wherein the black matrices of the flexible area locate on the vertical projections of the opaque areas between pixels when the flexible area is bending.

In this embodiment, the etching the etching material layer to form black matrices on the glass substrate further comprising:

exposing the etching material layer by a first photomask to form black matrices with predetermined width on the glass substrate; overlapping the second photomask on the first photomask and exposing the etching material layer by the first photomask and the second photomask to narrow he black matrices of the flexible area; and wherein the black matrices of the flexible area are narrower than the black matrices on the other area.

In this embodiment, the forming an etching material layer on a surface of the glass substrate further comprising: forming a positive photoresist material layer on a surface of the glass substrate to provide the etching material layer; and wherein portions vertically projecting to the black matrix of the first photomask are opaque areas, the other portions of the first photomask are transparent areas; wherein portions corresponding to the flexible area of second photomask are transparent areas, and the other portions of the second photomask are opaque areas.

According to discussing above, the present invention further comprising providing the second photomask before the etching step: providing a light proof baffle and a curved display panel made by a color filter substrate with same size of the glass substrate; driving the curved display panel and marking a shadow showed on the curved display panel; spreading the curved display panel and emptying the light proof baffle according to the marked shadow to form a empty area which is the same as the shadow area on the light proof.

Finally, the invention discusses a display panel, comprising: a matrix substrate and a color filter substrate; wherein the matrix substrate contains a transparent pixel area and a opaque area between pixels, and the color filter substrate contains a glass substrate and a black matrix; wherein the glass substrate contains flexible area, and the black matrix is on glass substrate; wherein the black matrix of the flexible area, which is narrower than the black matrix on the other area, locates on a vertical projection of a opaque area between pixels when the flexible area is bending.

DETAILED DESCRIPTION OF EMBODIMENTS

Figure 3:
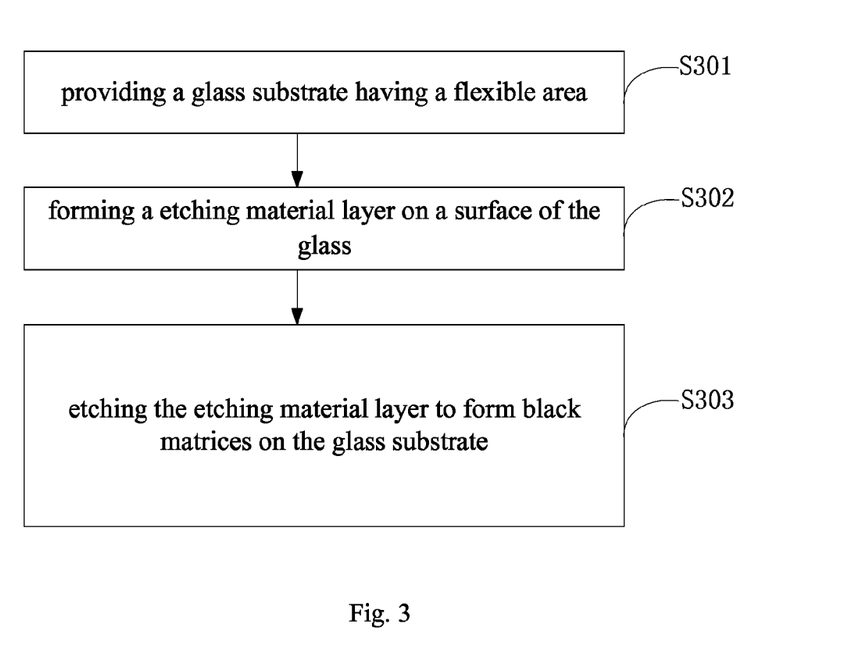
FIG. 3 is a flow chart of the methods according to an embodiment of the present invention for fabricating color filter substrates.

Referring to FIG. 3, the method of the present invention for fabricating color filter substrates is shown as below.

First, at step S301, providing a glass substrate having a flexible area.

At step S302, forming an etching material layer on a surface of the glass substrate for forming back matrices on the color filter substrate.

At step S303, etching the etching material layer to form black matrices on the glass substrate. The black matrices on the flexible area are narrower than the black matrices on the other areas; therefore, the black matrices of the flexible area, between pixels, aligning to the vertical projections of opaque areas when the flexible area is bending.

The etching of step S303 may etch by an exposing process or by a screen printing process. The lithography process contains exposing, developing, drying, etching, and stripping. The screen printing process contains cleaning, screen printing, etching, and stripping. And the etching of step S303 may proceed by dry etching or wet etching.

Black matrices are used as the materials for separating the RGB on the color filter substrate and used for proofing lights to improve color contract and to reduce light leakage. And black matrices, which are aligning to the opaque areas, lie on vertical projections of opaque areas on the glass substrate.

In the present invention, the width of the black matrices on the flexible area are smaller than the black matrices on the other areas. Therefore, when the flexible area is bending, the black matrices of the flexible area are aligning to, not be shifted out, the vertical projections of opaque areas between pixels to prevent shadows and improve the transmittance.

Figure 4:
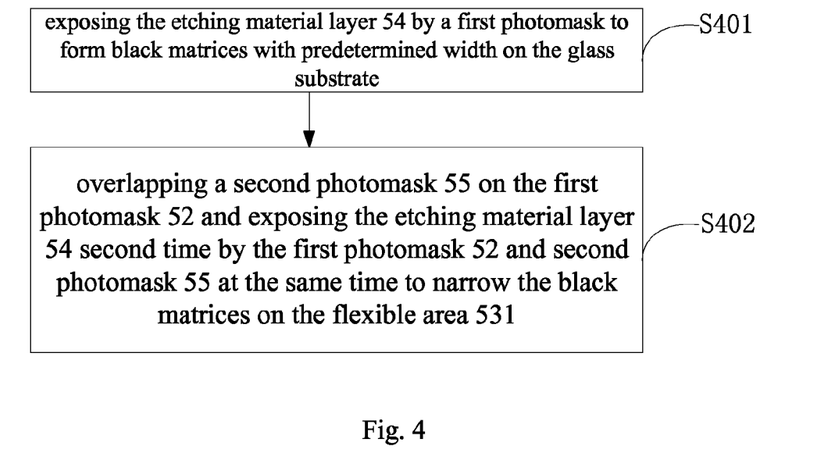
FIG. 4 is a flow chart of forming black matrices by etching the etching material layer according to an embodiment of the present invention for fabricating color filter substrates.
Figure 5:
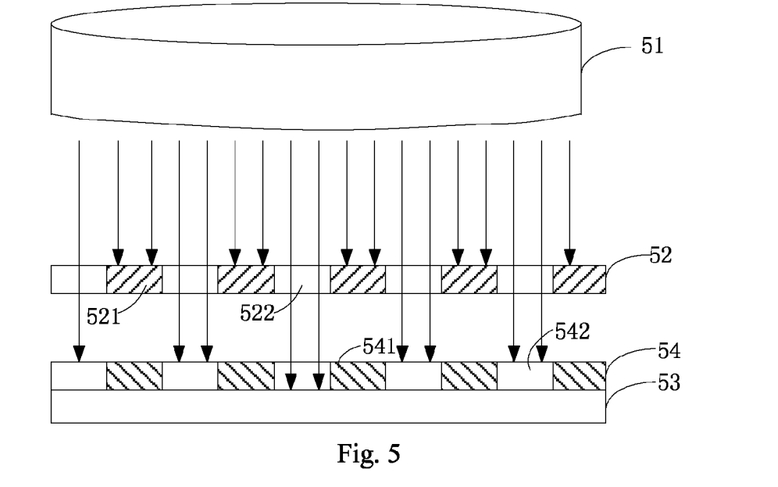
FIG. 5 is a graph showing the first exposing of the etching material layer by a first photomask according to an embodiment of the present invention for fabricating color filter substrates.
Figure 6:
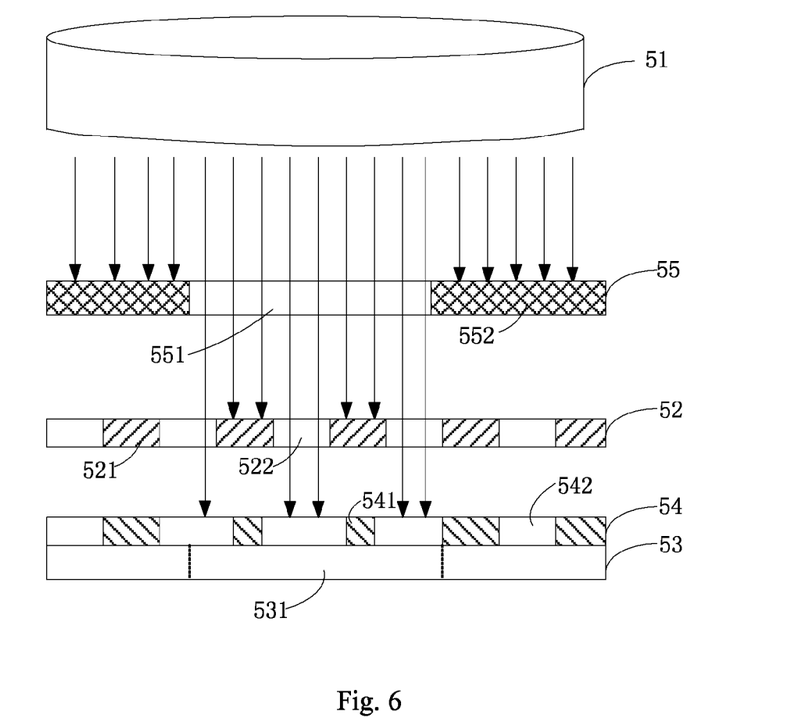
FIG. 6 is a graph showing the second exposing of the etching material layer by a first photomask and a second photomask according to an embodiment of the present invention for fabricating color filter substrates.

Referring to FIG. 4 to FIG. 6, the methods of the present invention, forming black matrices on the glass substrate by the second lithography process, comprising: forming a positive photoresist material layer as etching material layer 54, and forming black matrices by etching the etching material layer 54 on the glass substrate. Wherein the black matrices on the flexible area are narrower than the black matrices on the other area.

At step S401, exposing the etching material layer 54 by a first photomask to form black matrices with predetermined width on the glass substrate.

Referring to FIG. 5, it shows the first exposing of the etching material layer by a first photomask.

In FIG. 5, first, provides a UV light source 51 and a first photomask 52. Portions of the first photomask 52 vertically projecting to the black matrices 541 are opaque areas 521; and the other portions of the first photomask 52, not vertically projecting to the black matrix 541, are transparent areas 522. In other words, lights shall pass through the portions of the first photomask 52 which are vertically aligning to the black matrices 541; and lights shall not pass through the other portions the first photomask 52 which are not vertically aligning to the black matrices 541, are light passed area. In an embodiment, the other portions the first photomask 52 are carved out. In another embodiment, the other portions the first photomask 52 are transparent glasses or plastics.

Secondly, in FIG. 5, the first photomask 52 is arranged above the glass substrate 53 and aligned the opaque areas 521 with the black matrices 541 for shading the black matrices 541. The portions on the glass substrate 53 for forming black matrices 541 is laid on the vertical projection of opaque areas between pixels.

The UV light source 51 is turned on with E1 energy after arranging the first photomask 52. The lights pass through the transparent areas 522 of the first photomask 52 to the sensing portions 542 of etching material layer 54. In the other hand, the other portions of the etching material layer 54 do not be exposed due to the opaque areas 521.

Then, the etching material layer 54 is developed after exposing. The sensing portions 542 is dissolved by developing solution and is moved from the glass substrate 53; but the portions of the etching martial 52 covered by the opaque areas 521 will be kept on the glass substrate 53 and become the black matrices 541.

In this embodiment, the opaque areas have predetermined width. Therefore, the black matrices 541 are formed with a predetermined width after the first exposing by the first photomask 52. Besides, the predetermined width is variable according to the usual width in this technical field or to user's requirements.

Step S402 comprises overlapping a second photomask 55 on the first photomask 52 and exposing the etching material layer 54 second time by the first photomask 52 and second photomask 55 at the same time to narrow the black matrices on the flexible area 531. The black matrices on the flexible area 531 will become narrower than the black matrices on the other areas of the glass substrate 53.

FIG. 6 is a graph showing the second exposing of the etching material layer by a first photomask 52 and a second photomask 55.

Referring to FIG. 6, a portion of second photomask 55 aligning to the flexible area 531 of the glass substrate 53 is a transparent area 551; and the other portions of the second photomask 55 are opaque areas 552. So lights shall pass through the portion of the second photomask 55 aligning to flexible area 531; and shall not pass through the other portions of the second photomask 55. Wherein the transparent area 551 is empty and same as the flexible 531 in shape.

After the first exporting, the second photomask 55 is overlapped on the first photomask 52. The transparent area 551 of the second photomask 55 is aligned to the flexible area 531 of the glass substrate 53. The opaque areas 552 of the second photomask 55 is positioned for shading the other areas of glass substrate 53. The second photomask 55 is bigger than or equal to the glass substrate 53.

Then, the UV light source 51 is turned again with E2 energy. Due to overlapping of the second photomask 55 and the photomask 52, only the lights passing through the transparent area 551 and the transparent area 522 shall radiate etching material layer 54 when the UV light source 51 radiates through the second photomask 55 and the photomask 52. In other words, only the portions of the etching material layer 54 is vertically aligned to the transparent area 551 and the transparent area 522 shall be radiated.

After the exposure is conducted twice as described above, the portions of the etching material layer 54 vertically aligning to the transparent area 551 and the transparent area 522 have been radiated twice and receive E1+E2 energy. The other portions of the etching material layer 54 has been radiated only once because the second exposure is shaded.

The etching amount of the etching material layer 54 is proportional to the exposure time and the energy exposed thereon. The black matrices 541 on the flexible area 531 are narrower than the black matrices of the other area, wherein the black matrices of the other area in the glass substrate 54 is kept constant in width after the first exposing. Besides, as the second exposing energy is getting stronger, the etching amount of the etching material layer 54 is more, and the width of the black matrices 541 is smaller. Therefore, the width of black matrices of the flexible area 5431 may be controlled by adjusting the energy of the second exposing E2. The width of the black matrices 541 on the flexible area 531 can be trimmed less than a critical width by adjusting the second exposing energy, wherein the critical width is the largest width of the black matrices 541 that makes the balck mactrices shift out of the opaque area when the flexible area is bending.

Figure 7A:
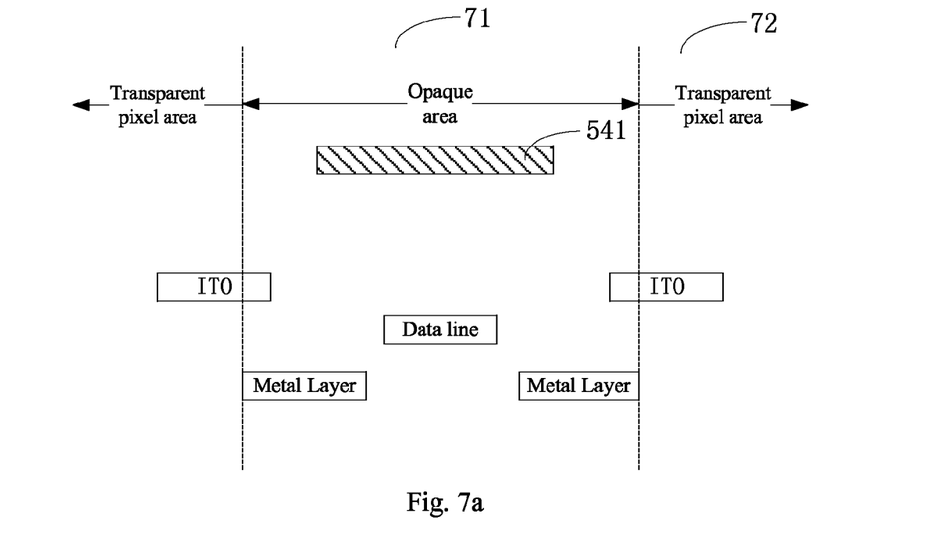
FIG. 7A is a graph showing the position of the black matrix after second exposing when the flexible area is not bending according to an embodiment of the present invention for fabricating color filter substrates.
Figure 7B:
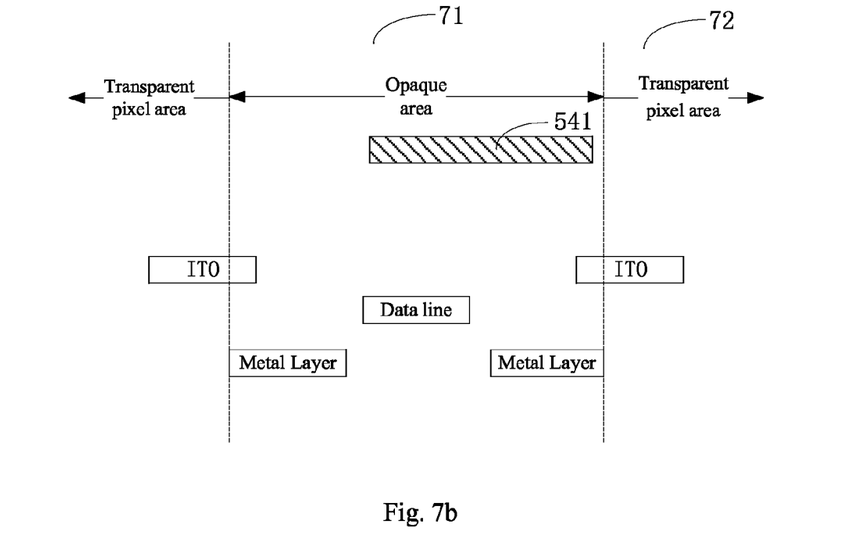
FIG. 7B is a graph showing the position of the black matrix after second exposing when the flexible area is bending according to an embodiment of the present invention for fabricating color filter substrates.

Referring to FIG. 7A and FIG. 7B, FIG. 7A is a figure showing the position of the black matrix after second exposing when the flexible area is not bending yet, and FIG. 7B is a figure showing the position of the black matrix after second exposing when the flexible area is bending.

Showed as the FIG. 7A and FIG. 7B, when the flexible area 531 is bending, the embodiment of the present invention make the black matrix 541 always locate within the vertical projection of the opaque area. The black matrices does not shift to the pixel transparent area 72 and shade. The shadow issue is reduced and the transmittance is improved. Since the black matrices of the other areas of the glass structure 53 merely been exposing once, these matrices still have regular widths to ensure the opaque rate of the other areas.

In the embodiment of present invention, the etching material layer is positive photoresist material layer. The etching material can be etched out by the second exposing process to trim down the width of the black matrices on the flexible are. Therefore, the transparent area of the pixel will not be shaded due to the dislocation of the black matrices when the flexible area is bending. The shadow issue is reduced and the transmittance is improved. Moreover, the width of the black matrices on the other area can be kept in a regular width, i.e. the width after the first lithography, to ensure the shading effect of the black matrices on the other area. Besides, the width of the black matrices in any shape can be controlled by the double exposure process mentioned above. The width of the black matrices can be controlled by adjusting the shape of the transparent area of the second photomask.

Figure 8:
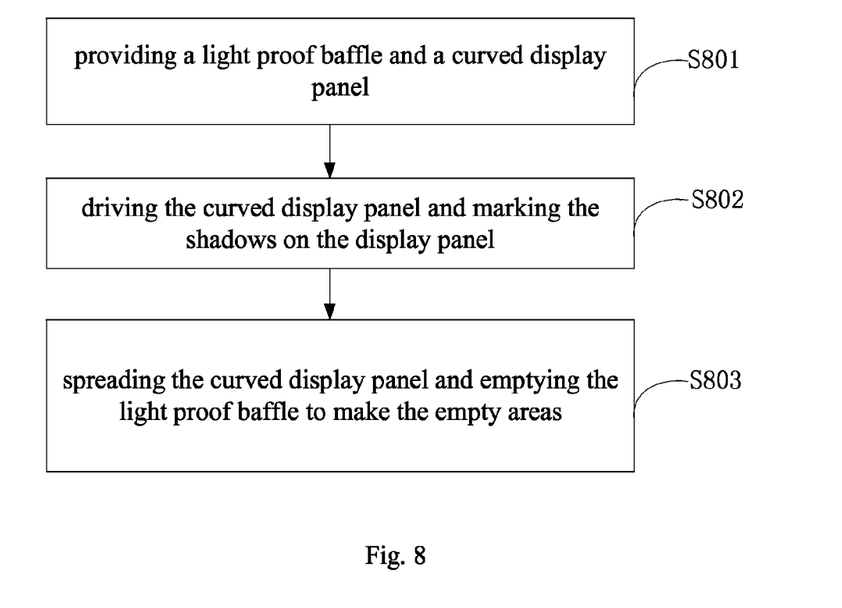
FIG. 8 is a flow chart of providing the second photomask according to an embodiment of the present invention for fabricating color filter substrates.

Referring to FIG. 8, the embodiment of present invention discloses production method of the second photomask by a light proof baffle before etching the etching material layer, comprising:

Step S801, providing a light proof baffle and a curved display panel. The, curved display panel are made by the color filter substrate having the same side of the glass substrate and the area of the light proof baffle is bigger than or equal to the curved display panel. The light proof baffle is made by light proof metal materials or nonmetal materials like copper, iron, alloy, plastic, or ceramic.

Step 802, driving the curved display panel and marking the shadows on the display panel.

Figure 9:
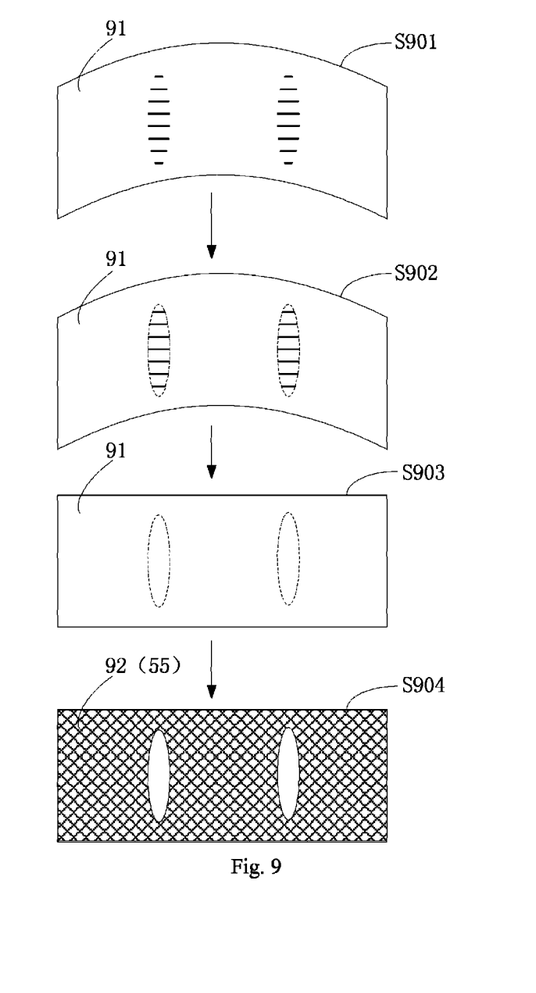
FIG. 9 is a graph showing the providing the second photomask according to an embodiment of the present invention for fabricating color filter substrates.

Referring the FIG. 9, FIG. 9 illustrates the providing the second photomask. At step S901 is driving the curved display panel 91 is driven, wherein shadows, showed as the ovals in FIG. 9, occur because the black matrices of the flexible area shifting out when the curve display panel 91 is bending. At Step S902, the shadow is marked on the curved display panel 91 as the dotted lines.

S803, spreading the curved display panel and emptying out the light proof baffle according to the shadow area marked on the display panel to fabricate the second photomask with the empty area which is identical with the shadow on the curved display panel in size and shape. S903 is spreading the curved display panel and S904 is emptying out the light proof baffle 92. The shadow area on the cured display panel is marked during displaying. Then, the curved display panel 91 is spreading, and the size and shape of the shadow area are confirmed according to the marking, like the dotted line in S903 of FIG. 9. According to the marking, the light proof baffle 92 is empty out to form an empty area which is identical with the shadow area in shape and in size. With reference to S903 in FIG. 9, the empty area is the transparent area in the light proof baffle 92. The second photomask 55 is generated by the emptying process mentioned above.

Figure 10:
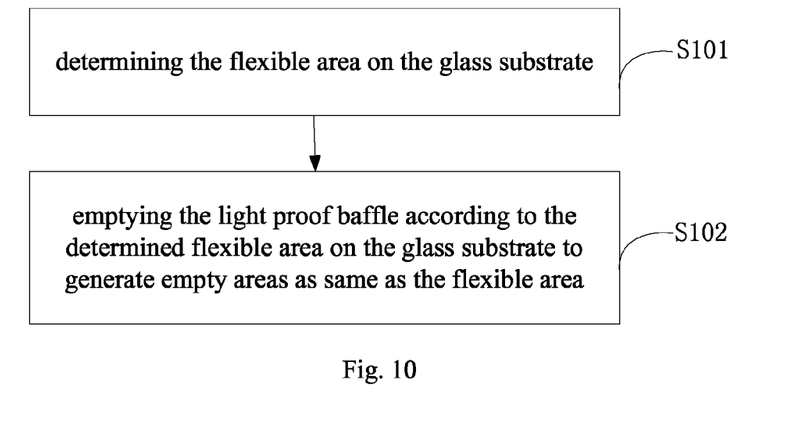
FIG. 10 is a flow chart of providing the second photomask according to another embodiment of the present invention for fabricating color filter substrates.

In another embodiment of the present invention, referring FIG. 10, the method to generate the second photomask, basing on the flexible area of the glass substrate, comprises:

Step S101, determining the flexible area on the glass substrate. Due to the curved display panel, it usually needs to determine the curved area on the glass substrate.

Step S102, emptying out the light proof baffle according to the determined flexible area on the glass substrate to generate to empty areas as same as the flexible area.

The empty area of the light proof baffle is the transparent area of the second photomask. Arranging the transparent area of the second photomask corresponding to the flexible area shall control the widths of the black matrices of the flexible area to prevent the black matrices 541 shifting out of the opaque area when the flexible area is bending.

In anther embodiment, making the black matrices of the flexible area narrower than the black matrices of the other area which is only exposed once, without the second exposing, is feasible as well.

For example, just narrow the masks of the first photomask directly corresponding to the flexible area, thus to make the black matrices on the flexible area narrower than the black matrices on the other area after merely once exposing.

In another embodiment of the present invention, the etching material lay is a negative photoresist material. Wherein the portion vertically projecting to the black matrices of the first photomask are transparent area, and the other portions of the first photomask are opaque area; and the portion according to the flexible area of the second photomask are opaque area, and the other portions of the second photomask are transparent areas.

Figure 11:
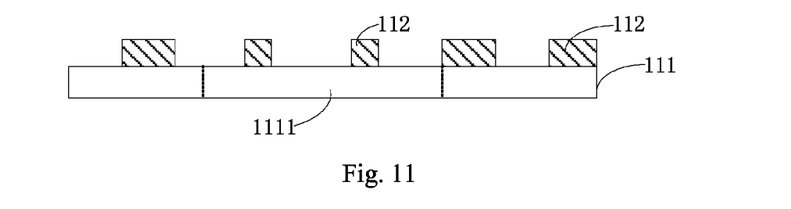
FIG. 11 is a graph showing a structure of a color filter substrate of an embodiment of the present invention.

Refer to FIG. 11, the color filter substrate contains a glass substrate 111 and black matrices 112, wherein the black matrices 112 are on the glass substrate 111, and the glass substrate 111 contains a flexible area 1111, wherein the black matrices 112 on the flexible area 1111 is narrower then the black matrices 112 on the other areas. Therefore, the black matrices 112 on the flexible area 1111 is located on, not be shifted out of, the light proof vertical projections between pixels when the flexible area 1111 is bending. According to above invention showed as FIG. 11, it shall prevent the black matrices hiding the transparent area, reduce shadows and improve the transmittance.

Figure 12:
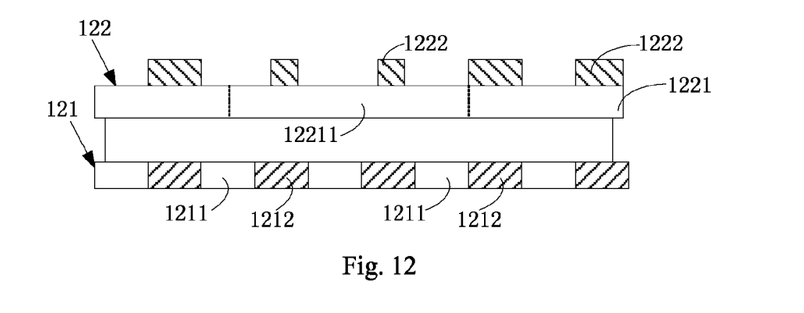
FIG. 12 is a graph showing a structure of a display panel according to an embodiment of the present invention.

Refer to FIG. 12, a display panel of the present invention contains a matrix substrate 121 and a color filter substrate 122. The matrix substrate 121 contains transparent pixel areas and opaque areas between pixels. The color filter substrate 122 contains a glass substrate 1221 and blacks matrices 1222. The black matrices 1222 are arranged on the glass substrate 1221 and laid on the opaque area on glass substrate 1221, wherein, the black matrices 1222 on the flexible area 12211 is narrower than the black matrices 1222 on the other areas. Therefore, the black matrices 1222 on the flexible area 1111 can be located on, not be shifted out of, the light proof vertical projections between pixels when the flexible area 12211 is bending. According to above invention in FIG. 12, it shall prevent the black matrices hiding the transparent area, reduce shadows and improve the transmittance.

Figure 13:
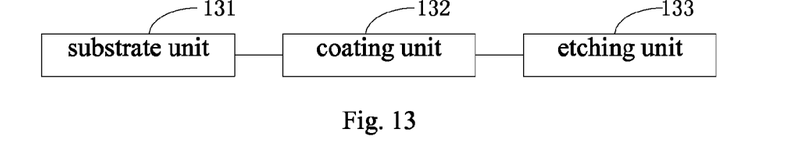
FIG. 13 is a graph showing a structure according to an embodiment of the present invention for fabricating color filter substrates.

Refer to FIG. 13, the present invention discloses a apparatus for fabricating color filter substrate comprising a substrate unit 131 having a glass substrate, wherein the glass substrate further comprising a flexible area; a coating unit 132 for forming an etching material layer on the surface of the glass substrate; a etching unit 133 having a first photomask and a second photomask, wherein the first photomask using for first exposing the etching material layer to forming black matrices with a predetermined width on the glass substrate, and the second photomask overlapping on the first photomask is using for second exposing the etching material layer to narrow the black matrices of the flexible area; wherein the black matrices on the flexible area are narrower than the black matrices on the other area; wherein the black matrices of the flexible area are corresponding with a vertical projection of a opaque area between pixels when the flexible area is bending; and wherein the second photomask, having a an empty area which is identical with the flexible area, is made from emptying the light proof baffle according to the flexible area of the glass substrate. According to above invention in FIG. 13, it shall prevent the black matrices hiding the transparent area, reduce shadows and improve the transmittance.

Figure 14:
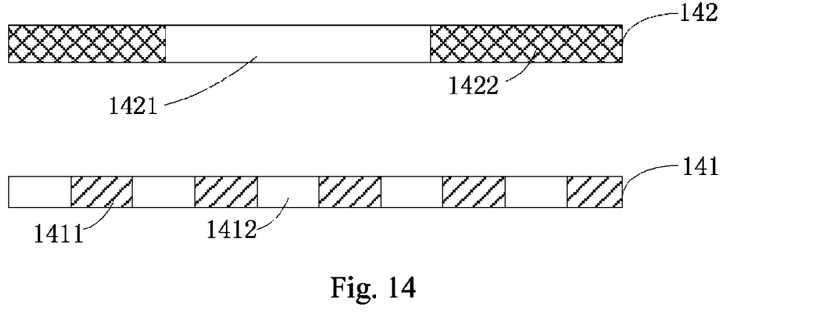
FIG. 14 is a graph showing a structure of the etching unit according to an embodiment of the present invention for fabricating color filter substrates

Refer to FIG. 13 and FIG. 14, the etching unit 131 contains a first photomask 141 and a second photomask 142, which are using for exposing the etching material layer.

The coating unit 132 is used for making a positive photoresist material layer on the surface on glass substrate as a etching material layer.

In FIG. 14, first, a UV light source and a first photomask 141 are provided. Portions of the first photomask 141 vertically projecting to the black matrices 1411 are opaque areas 1411; and the other portions of the first photomask 141, not vertically projecting to the black matrix 1411, are transparent areas 1412. In other words, lights shall pass through the portions of the first photomask 141 which are vertically aligning to the black matrices 1411; and lights shall not pass through the other portions the first photomask 141 which are not vertically aligning to the black matrices 1411, are light passed area. In an embodiment, the other portions the first photomask 141 are empty; and n another embodiment, the the other portions the first photomask 141 are transparent glasses or plastics.

Secondly, in FIG. 14, the first photomask 141 is arranged above the glass substrate and the opaque areas 1411 is aligned to the black matrices 1411 for hiding the black matrices 1411, wherein, the portions on the glass substrate for forming black matrices 1411 is laid on the vertical projection of opaque areas between pixels Then, the UV light source is turned with E1 energy after arranging the first photomask 141. The lights pass through the transparent areas 1412 of the first photomask 141 to the sensing portions 1412 of etching material layer 141. On the other hand, the other portions of the etching material layer 141 do not be exposed due to the opaque areas 1411.

Then, the etching material layer 141 is developed after exposing. The sensing portions 1412 is dissolved by developing solution and be moved from the glass substrate; but the portions of the etching martial 141 covered by the opaque areas 1411 will be keep on the glass substrate and become the black matrices 1411.

In this embodiment, the opaque areas have predetermined widths to forming the black matrices 1411 with the predetermined width after the first exposing by the first photomask 141, wherein the predetermined width is variable and can be set according to the usual width in this technical field or to user's requirements.

Step S402 comprises overlapping a second photomask 142 on the first photomask 141 and exposing the etching material layer 141 second time by the first photomask 141 and second photomask 142 at the same time to narrow the black matrices on the flexible area. Wherein, the black matrices on the flexible area will become narrower than the black matrices on the other areas of the glass substrate.

An a portion of second photomask 142 aligning to the flexible area of the glass substrate is a transparent area 1421; and the other portions of the second photomask 142 are opaque areas 1422. So lights shall pass through the portion of the second photomask 142 aligning to flexible area; and shall not pass through the other portions of the second photomask 142. Wherein the transparent area 1421 is empty and same as the flexible in shape.

After the first exposure, the second photomask 142 is overlapped with the first photomask 141. The transparent area 1421 of the second photomask 142 is aligned to the flexible area of the glass substrate, and the other areas of glass substrate, wherein, the second photomask 142 is larger than or equal to the glass substrate.

Then, the UV light source is turned on again with E2 energy. Due to overlapping of the second photomask 142 and the photomask 141, when the UV light source radiates through the second photomask 142 and the photomask 141, only the lights passing through the transparent area 1421 and the transparent area 1412 shall radiate etching material layer 141. In other words, only the portions of the etching material layer 141 vertically aligning to the transparent area 1421 and the transparent area 1412 shall be radiated.

After above two times exposing, the portions of the etching material layer 141 vertically aligning to the transparent area 1421 and the transparent area 1412 have been radiated twice and receive E1+E2 energy. The other portions of the etching material layer 141 merely been radiate once or not.

Obviously, the mount of material been etched out is proportional to the radiating energy exposed thereon. The black matrices 1411 on the flexible area shall been etched more than the black matrices of the other area, therefore, the black matrices 1411 on the flexible area are narrower than the black matrices of the other area. Moreover, it may control the width of black matrices of the flexible area by adjusting the energy of the second exposing to prevent the black matrices 1411 shifting out of the opaque area when the flexible area is bending.

Although the description above contains much specificity, these should not be construed as limiting the scope of the embodiment but as merely providing illustrations of some of the presently preferred embodiments. Rather, the scope of the invention is to be determined only by the appended claims and their equivalents.

What is claimed is:

1. A method for fabricating a color filter substrate, the method comprising:
    providing a glass substrate which has a flexible area;
    forming an etching material layer on a surface of the glass substrate; and
    etching the etching material layer to form black matrices laid in vertical projections on the glass substrate of opaque areas between pixels, wherein the black matrices on the flexible area of the glass substrate are narrower than the black matrices on the other areas of the glass substrate; and
    wherein the black matrices on the flexible area of the glass substrate still lie in the vertical projections on the glass substrate of the opaque areas between pixels when the flexible area is bending;
    wherein the etching the etching material layer to form black matrices comprises:
        exposing the etching material layer by a first photomask to form black matrices with predetermined width laid in the vertical projections on the glass substrate of the opaque areas between pixels; and
        overlapping a second photomask on the first photomask and exposing the etching material layer by the first photomask and the second photomask together to narrow the black matrices on the flexible area, wherein the black matrices on the flexible area of the glass substrate are narrower than the black matrices on the other area of the glass substrate.

2. The method of the claim 1, wherein the forming an etching material layer on a surface of the glass substrate comprises:
    forming a positive photoresist material layer on the surface of the glass substrate to provide the etching material layer; and
    wherein portions of the first photomask vertically overlapping the black matrices are opaque areas, the other portions of the first photomask are transparent areas;
    wherein portions of the second photomask corresponding to the flexible area are transparent areas, and the other portions of the second photomask are opaque areas.

* * * * *